(12) United States Patent
Gomm et al.

(10) Patent No.: US 7,212,057 B2
(45) Date of Patent: May 1, 2007

(54) MEASURE-CONTROLLED CIRCUIT WITH FREQUENCY CONTROL

(75) Inventors: Tyler J. Gomm, Meridian, ID (US); Debra M. Bell, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/771,611

(22) Filed: Feb. 4, 2004

(65) Prior Publication Data

US 2004/0156245 A1 Aug. 12, 2004

Related U.S. Application Data

(63) Continuation of application No. 10/147,657, filed on May 16, 2002, now Pat. No. 6,801,070.

(51) Int. Cl.
*H03H 11/26* (2006.01)

(52) U.S. Cl. ....................... 327/263; 327/161

(58) Field of Classification Search ................ 327/147, 327/149, 156, 158, 161, 163, 276, 263
See application file for complete search history.

(56) References Cited

U.S. PATENT DOCUMENTS

| | | | |
|---|---|---|---|
| 3,955,158 A | 5/1976 | Upadhyayula et al. | |
| 3,993,957 A | 11/1976 | Davenport | |
| 5,691,660 A | 11/1997 | Busch et al. | |
| 5,717,353 A | 2/1998 | Fujimoto | |
| 5,930,182 A | 7/1999 | Lee | 365/194 |
| 5,946,244 A | 8/1999 | Manning | |
| 6,002,281 A | 12/1999 | Jones et al. | |
| 6,081,462 A | 6/2000 | Lee | 365/194 |
| 6,085,345 A | 7/2000 | Taylor | |
| 6,088,255 A * | 7/2000 | Matsuzaki et al. | 365/76 |
| 6,108,793 A | 8/2000 | Fujii et al. | |
| 6,172,537 B1 | 1/2001 | Kanou et al. | |
| 6,181,174 B1 | 1/2001 | Fujieda et al. | |
| 6,184,753 B1 | 2/2001 | Ishimi et al. | |
| 6,219,384 B1 * | 4/2001 | Kliza et al. | 375/258 |
| 6,275,079 B1 | 8/2001 | Park | |
| 6,292,040 B1 | 9/2001 | Iwamoto et al. | |
| 6,313,676 B1 * | 11/2001 | Abe et al. | 327/158 |
| 6,316,976 B1 | 11/2001 | Miller, Jr. et al. | 327/156 |

(Continued)

OTHER PUBLICATIONS

Jang, Seong-Jin, et al., "A Compact Ring Delay Line for High Speed Synchronous DRAM", *IEEE 1998 Symposium on VLSI Circuits Digest of Technical Papers*, (Jun. 11-13, 1998), 60-61.

(Continued)

*Primary Examiner*—Timothy P. Callahan
*Assistant Examiner*—Cassandra Cox
(74) *Attorney, Agent, or Firm*—Schwegman, Lundberg, Woessner & Kluth, P.A.

(57) ABSTRACT

A delay locked circuit has multiple paths for receiving an external signal. One path measures a timing of the external signal during a measurement. Another path generates an internal signal based on the external signal. The delay locked circuit periodically performs the measurement to keep the external and internal signals synchronized. The time interval between one measurement and the next measurement is unequal to the cycle time of the external signal.

36 Claims, 10 Drawing Sheets

U.S. PATENT DOCUMENTS

| | | | |
|---|---|---|---|
| 6,374,360 B1 | 4/2002 | Keeth et al. ................. 713/400 |
| 6,378,079 B1 | 4/2002 | Mullarkey |
| 6,381,194 B2 | 4/2002 | Li ............................... 365/233 |
| 6,385,129 B1 | 5/2002 | Silvestri ...................... 365/233 |
| 6,388,480 B1 | 5/2002 | Stubbs et al. ............... 327/156 |
| 6,414,903 B1 | 7/2002 | Keeth et al. |
| 6,421,789 B1 * | 7/2002 | Ooishi ........................... 714/7 |
| 6,421,801 B1 | 7/2002 | Maddux et al. |
| 6,438,060 B1 | 8/2002 | Li ............................... 365/227 |
| 6,446,180 B2 | 9/2002 | Li et al. ...................... 711/167 |
| 6,456,130 B1 | 9/2002 | Schnell |
| 6,476,653 B1 * | 11/2002 | Matsuzaki .................. 327/158 |
| 6,492,852 B2 | 12/2002 | Fiscus |
| 6,605,969 B2 | 8/2003 | Mikhalev et al. ........... 327/158 |
| 6,876,594 B2 | 4/2005 | Griesmer et al. |
| 2002/0017939 A1 | 2/2002 | Okuda et al. |
| 2002/0130691 A1 | 9/2002 | Silvestri ...................... 327/158 |
| 2003/0011414 A1 | 1/2003 | Bell ............................ 327/233 |
| 2003/0012320 A1 | 1/2003 | Bell ............................ 375/376 |
| 2003/0079639 A1 | 9/2003 | Bell et al. .............. 365/230.08 |
| 2003/0214334 A1 | 11/2003 | Gomm et al. ................ 327/158 |
| 2003/0214338 A1 | 11/2003 | Silvestri ...................... 327/276 |
| 2003/0215040 A1 | 11/2003 | Bell et al. |

OTHER PUBLICATIONS

Kim, Jae J., et al., "A low-jitter mixed-mode DLL for high-speed DRAM applications", *IEEE Journal of Solid State Circuits*, 35(10), (Oct. 2000), 1430-1436.

Tamura, H., et al., "Partial response detection technique for driver power reduction in high speed memory-to-processor communications", *IEEE International Solid-State Circuits Conference, 1997. Digest of Technical Papers, 44th ISSCC.*, (1997),342-343, 482.

* cited by examiner

MEASURE-CONTROLLED CIRCUIT WITH FREQUENCY CONTROL

This application is a Continuation of U.S. application Ser. No. 10/147,657, filed May 16, 2002, now U.S. Pat. No. 6,801,070, which is incorporated herein by reference.

FIELD

The present invention relates generally to integrated circuits, and in particular to delay locked circuits.

BACKGROUND

Delay locked circuits reside in many integrated circuits for delaying an external signal to obtain an internal signal. The delay locked circuit automatically tracks the external and internal signals to keep them synchronized. The internal signal usually serves as a reference signal for the integrated circuits instead of the external signal because the internal signal matches internal operating conditions of the integrated circuits, such as process, voltage, and temperature, better than the external signal does.

One type of delay locked circuit measures a timing of the external signal in every cycle (period) of the external signal. Based on the measurement, the delay locked circuit adjusts the delay applied to the external signal to keep the external and internal signals synchronized.

In many cases, the operating conditions of the integrated circuit remain unchanged for a time substantially greater than the cycle time of the external signal. Therefore, measuring the external signal to adjust the delay in every cycle time of the external signal wastes power.

SUMMARY OF THE INVENTIONS

Various embodiments of the invention provide circuits and methods to operate a delay locked circuit more efficiently.

In one aspect, the delay locked circuit includes a measuring unit for obtaining a reference time based on a cycle time of an external signal during a measurement on a first path of the external signal. The delay locked circuit uses the reference time to acquire a measured delay. An adjusting unit adjusts a delay on a second path of the external signal based on the measured delay. The delay locked circuit also includes an interval controller for controlling a time interval between one measurement and the next measurement.

In another aspect, a method of processing signals includes propagating an external signal on a measuring path. A measurement is performed on the measuring path to acquire a measured delay. The method also propagates the external signal on an output path to produce an internal signal. A correction delay based on the measured delay is applied to the output path. The method further performs another measurement at a time interval unequal to the cycle time of the external signal.

DESCRIPTION OF EMBODIMENTS

The following description and the drawings illustrate specific embodiments of the invention sufficiently to enable those skilled in the art to practice it. Other embodiments may incorporate structural, logical, electrical, process, and other changes. Examples merely typify possible variations. Portions and features of some embodiments may be included in or substituted for those of others. The scope of the invention encompasses the full ambit of the claims and all available equivalents.

Figure 1:
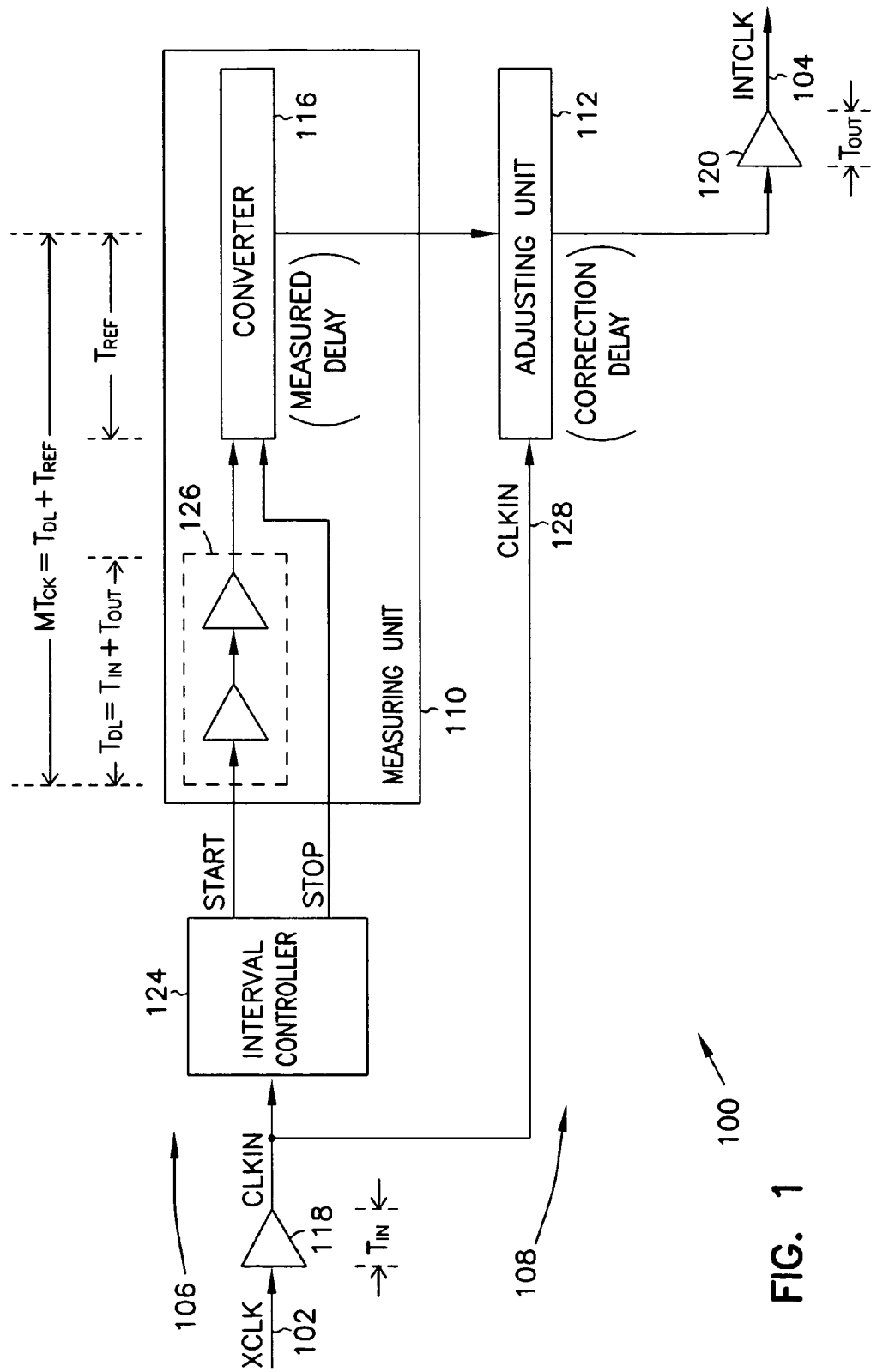
FIG. 1 shows a delay locked circuit according to an embodiment of the invention.

FIG. 1 shows a delay locked circuit according to an embodiment of the invention. Delay locked circuit 100 includes an external node 102 for receiving an external signal XCLK and an internal node 104 for outputting and internal signal INTCLK. The XCLK signal propagates on two paths, a measuring path 106 and an output path 108. Measuring path 106 has a measuring unit 110 for periodically performing a measurement to measure a timing of the XCLK signal. Output path 108 has an adjusting unit 112 for periodically adjusting a delay of output path 108 based on the measurement.

Measuring unit 110 includes a delay model circuit 114 and a converter 116. During each measurement, delay model circuit 114 delays a signal by an amount of time $T_{DL}$. Converter 116 converts a reference time $T_{REF}$ into a measured delay. $T_{REF}$ is a measurement of time, whereas the measured delay is a quantity other than time but depending on $T_{REF}$.

Delay model circuit 114 is modeled after a combination of an input buffer 118 and an output buffer 120 so that a time delay of delay model circuit 114, $T_{DL}$, equals the sum of a time delay of input buffer 118, $T_{IN}$, and a time delay of output buffer 120, $T_{OUT}$, ($T_{DL}=T_{IN}+T_{OUT}$).

The XCLK signal has a cycle time $T_{CK}$. The sum of $T_{DL}$ and $T_{REF}$ equals one or more cycle times of the XCLK signal. $MT_{CK}=T_{DL}+T_{REF}$ or $T_{REF}=MT_{CK}-T_{DL}$, where M is an integer equal to or greater than one.

Adjusting unit 112 includes a correction delay line 122 for applying a correction delay to the output path 108 based on the measured delay. The correction delay and the measured delay have an equal delay quantity.

On output path 108, the XCLK signal propagates from node 102 through input buffer 118, the correction delay line 122, and output buffer 120 to become the INTCLK signal. The INTCLK signal and the XCLK signal are synchronized because the correction delay equals the measured delay. As shown in FIG. 1, $MT_{CK}=T_{DL}+T_{REF}$ where $T_{DL}=T_{IN}+T_{OUT}$, and the correction delay corresponds to $T_{REF}$. Thus, $MT_{CK}=T_{IN}+T_{OUT}+T_{REF}$. On output path 108, $T_{IN}+T_{OUT}+T_{REF}$ is the delay applied to the XCLK signal when it travels from node 102 to node 104 to become the INTCLK signal. Hence, the INTCLK signal is the XCLK signal delayed by $T_{IN}+T_{OUT}+T_{REF}$. Since $MT_{CK}=T_{IN}+T_{OUT}+T_{REF}$, the INTCLK signal is the XCLK signal delayed by $MT_{CK}$.

Delay locked circuit 100 further includes an interval controller 124 connected to measuring unit 110. Interval controller 124 receives an input signal CLKIN and generates a measuring start signal START and a measuring stop signal STOP. The START and STOP signals control a time interval between one measurement and the next measurement and control the duration of each measurement. The START signal starts a measurement and the STOP signal stops the measurement. The START signal is a periodic signal. Interval controller 124 sets the time interval between one measurement and the next measurement to be equal to the cycle time of the START signal. Interval controller 124 sets the duration of each measurement to be one or more cycle times of the XCLK signal and less than the cycle time of the START signal.

Figure 2:
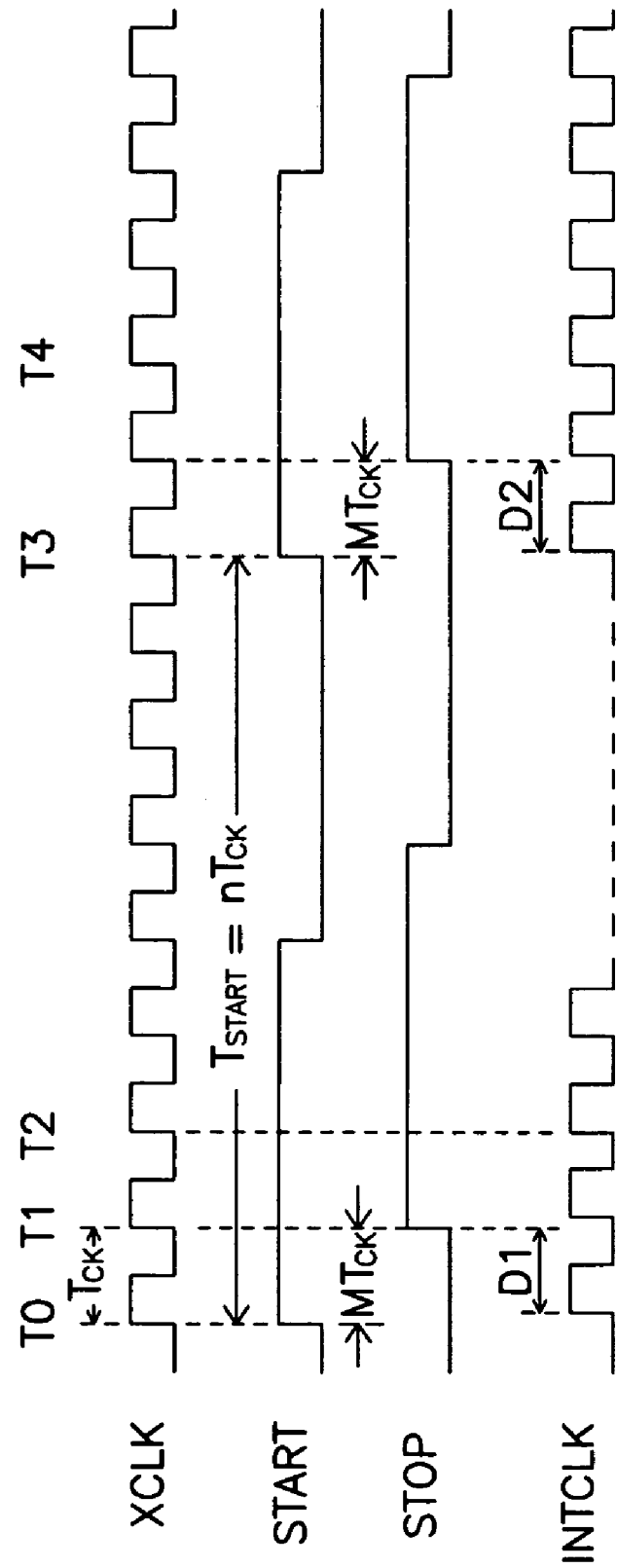
FIG. 2 shows an example of a timing diagram for FIG. 1.

FIG. 2 shows an example of a timing diagram for FIG. 1. D1 and D2 indicate a time delay between the XCLK and INTCLK signals at time T0 and T3, respectively. Interval controller 124 activates the START signal (high) at time T0 to start a measurement and activates the STOP signal at times T1 to stop the measurement. Between these times, measuring unit 110 performs a measurement based on $T_{REF}$ to obtain the measured delay. In FIG. 2, the duration of the measurement is one cycle time of the XCLK signal. Therefore, M equals one and $T_{REF}$ equals one $T_{CK}$ minus $T_{DL}$. Between times T1 and T2, adjusting unit 112 applies a correction delay to output path 108 based on the measured delay. At time T2, the XCLK and INTCLK signals become synchronized. The process repeats between times T3–T4. At time T3, interval controller 124 activates the START signal again to start a new measurement. The XCLK and INTCLK signals may be out of synchronization at time T3. For example, at time T3, the XCLK and INTCLK signals have a delay D2. Adjusting unit 112 applies another correction delay based on the measured delay obtained by the new measurement.

The time interval between one measurement and the next measurement equals the cycle time of the START signal $T_{START}$. $T_{START}=NT_{CK}$, where N is greater than one. Thus, $T_{START}$ is greater than $T_{CK}$. The STOP signal has a cycle time $T_{STOP}$. In FIG. 2, $T_{STOP}$ equals $T_{START}$. In some embodiments, $T_{STOP}$ is unequal to $T_{START}$.

The duration of each measurement equals the time interval between the activations of the START and STOP signals. This time interval equals $MT_{CK}$. In FIG. 2, M equals one. Therefore, the duration of each measurement equals one $T_{CK}$. In some embodiments, M is greater than one and less than N. Thus, the duration of each measurement equals more than one $T_{CK}$.

In FIG. 2, since the time interval between one measurement and the next measurement equals $T_{START}$ where $T_{START}$ is greater than $T_{CK}$, the number of measurements based on $T_{START}$ is less than the number of measurements based on $T_{CK}$. Therefore, using $T_{START}$ instead of $T_{CK}$ between one measurement and the next measurement saves power.

Figure 3:
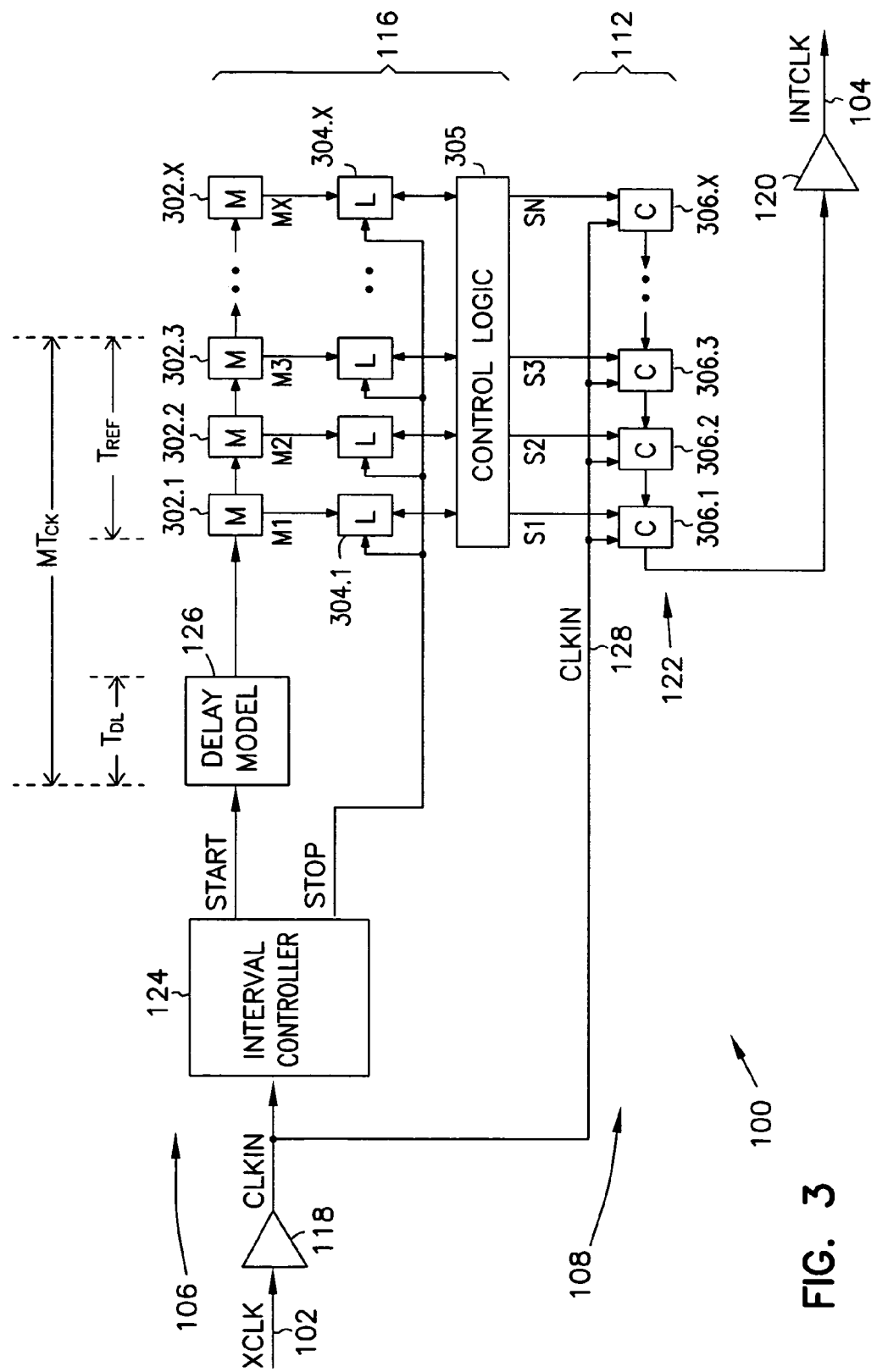
FIG. 3 shows more detail of the delay locked circuit of FIG. 1.

FIG. 3 shows more detail of the delay locked circuit of FIG. 1. Converter 116 has a number of measuring delay elements (M) 302.1–302.X connected to a number of storage elements (L) 304.1–304.X. Measuring delay elements 302.1–302.X have output nodes to output signals M1–MX. A control logic 305 determines the contents of storage elements 304.1–304.X to activate one of the select signals S1–SN. Correction delay line 122 having a number of correction delay elements (C) 306.1–306.X, each being controlled by one of the S1–SN signals. The CLKIN signal enters correction delay line 122 at a variable entry point at any one of the inputs of correction delay elements 306.1–306.X. The CLKIN signal exits the correction delay line 122 at fixed exit point at the output of correction delay elements 306.1. Control logic 305 activates one of the select signals S1–SN to select the entry point.

Storage elements 304.1–304.X can be flip flops, latches, registers, or other devices capable of storing a state (level) of a signal. Each of the measuring delay elements and each of correction delay elements delays a signal for an equal amount of delay.

In a measurement, interval controller 124 activates the START signal at a starting time of the measurement. For example, at starting time T0, the START signal is activated and propagates through delay model circuit 114 for a time equal to $T_{DL}$. At time $T0+T_{DL}$, the START signal enters measuring delay elements 302.1 and propagates through a certain number measuring delay elements for a time equal to $T_{REF}$. For example, the START signal propagates through three measuring delay elements during $T_{REF}$. At time $T0+T_{DL}+T_{REF}$, or after $MT_{CK}$ from T0, the STOP signal is activated to enable storage elements 304.1–304.X to latch the M1–MX signals.

Control logic 305 examines the contents of storage elements 304.1–304.X to determine the last measuring delay elements reached by the START signal when the STOP signal is activated. Based on the contents of storage elements 304.1–304.X, control logic 305 activates one of the S1–SN signals to select the entry point. The CLKIN signal enters the entry point and propagates through a number of correction delay elements equal to the number of measuring delay elements that the START signal propagates through during $T_{REF}$. The CLKIN signal becomes the INTCLK signal at node 104.

In the example where the START signal propagates through three measuring delay elements during $T_{REF}$, control logic 305 activates the S3 signal to select the entry point at correction delay element 306.3. The CLKIN signal propagates from the entry point to node 104 through three correction delay elements 306.1–306.3. Thus, the measured delay equals three measuring delay elements and the correction delay equals three correction delay elements. Since each of the measuring delay elements and each of correction delay elements delays a signal for an equal amount of delay, the correction delay equals the measured delay.

Figure 4:
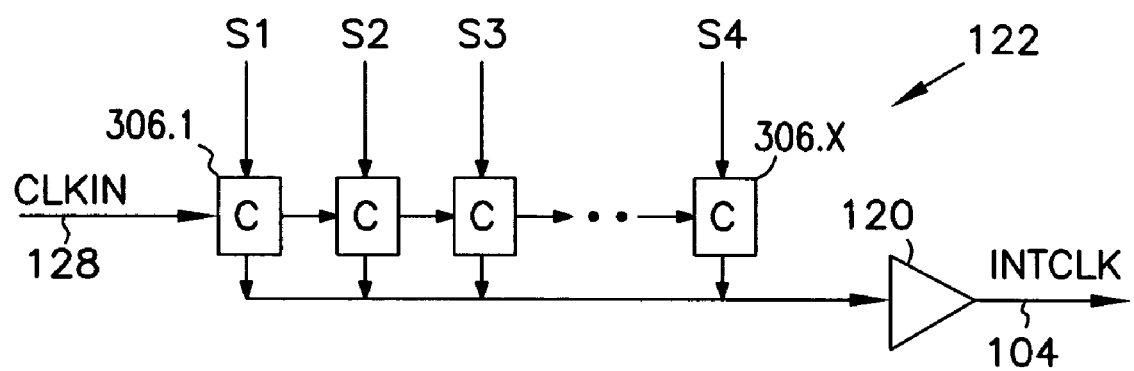
FIG. 4 shows another embodiment of correction delay line of FIG. 3.

FIG. 4 shows another embodiment of correction delay line 122 of FIG. 3. In FIG. 4, the CLKIN signal enters correction delay line 122 at a fixed entry point at correction delay element 306.1. The CLKIN signal exits correction delay line 122 at a variable exit point at any one of the outputs of correction delay elements 306.1–306.X. Control logic activates one of the S1–SN signals to select the exit point. For example, when the S3 signal is activated, the CLKIN signal exits correction delay line 122 at correction delay element 306.3 after propagating through three correction delay elements 306.1–306.3.

Figure 5:
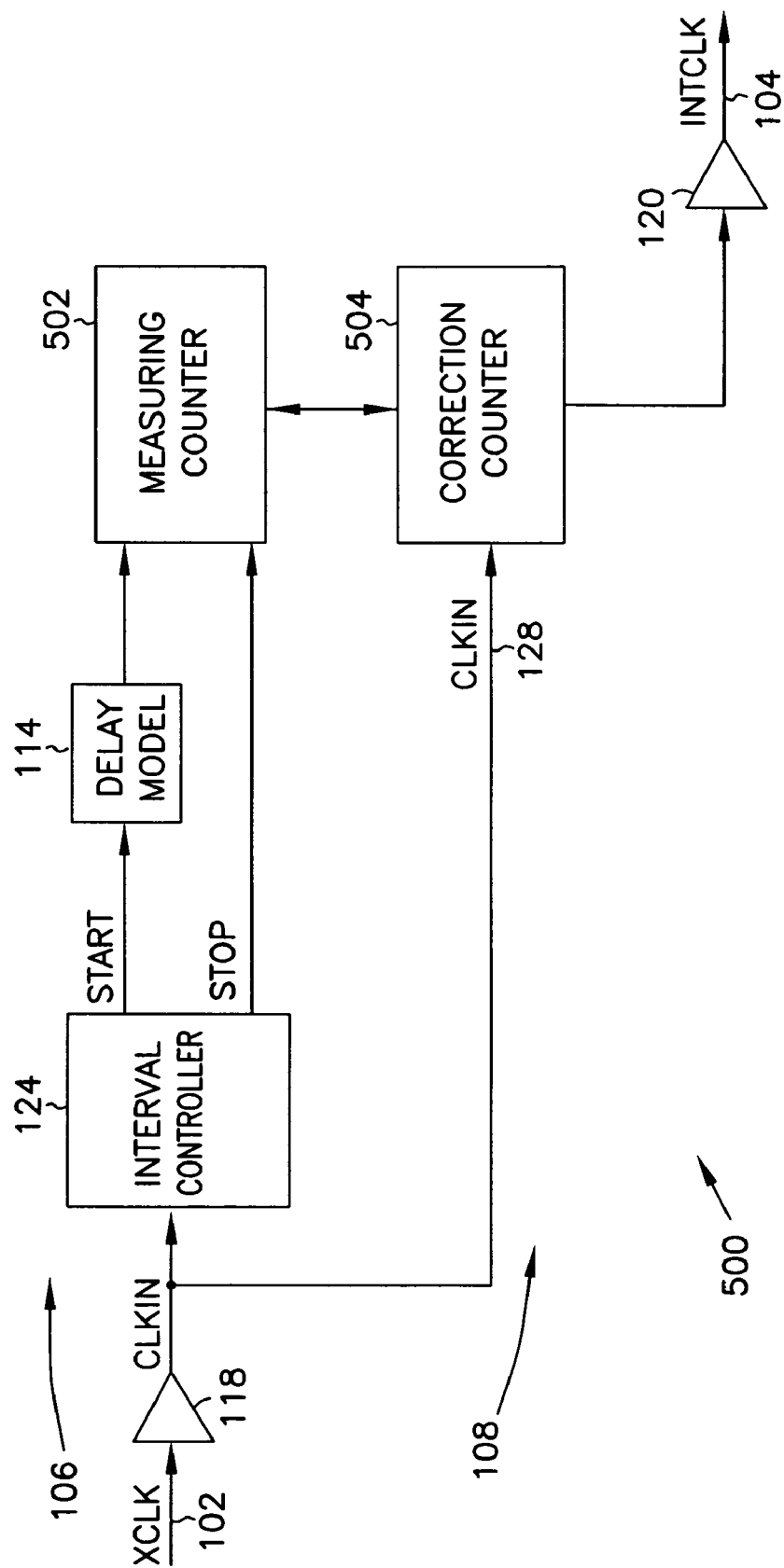
FIG. 5 shows a delay locked circuit having counters according to an embodiment of the invention.

FIG. 5 shows a delay locked circuit having counters according to an embodiment of the invention. Delay locked circuit 500 has measuring path 106 and output path 108. Measuring path 106 has a measuring counter 502. Output path 108 has a correction counter 504. Measuring path 106 obtains a measured delay while counter 502 counts up during $T_{REF}$. Output path 108 applies a correction delay equal to the measured delay while correction counter 504 counts down.

During time $T_{REF}$ of a measurement, measuring counter 502 counts up from zero to a counted number. The START signal starts the count. The STOP signal stops the count. The counted number corresponds to the measured delay. Correction counter 504 loads the counted number and counts down from the counted number to zero. Based on the count down by correction counter 504, output path 108 applies a correction delay to the CLKIN signal equal to the measured delay.

Figure 6:
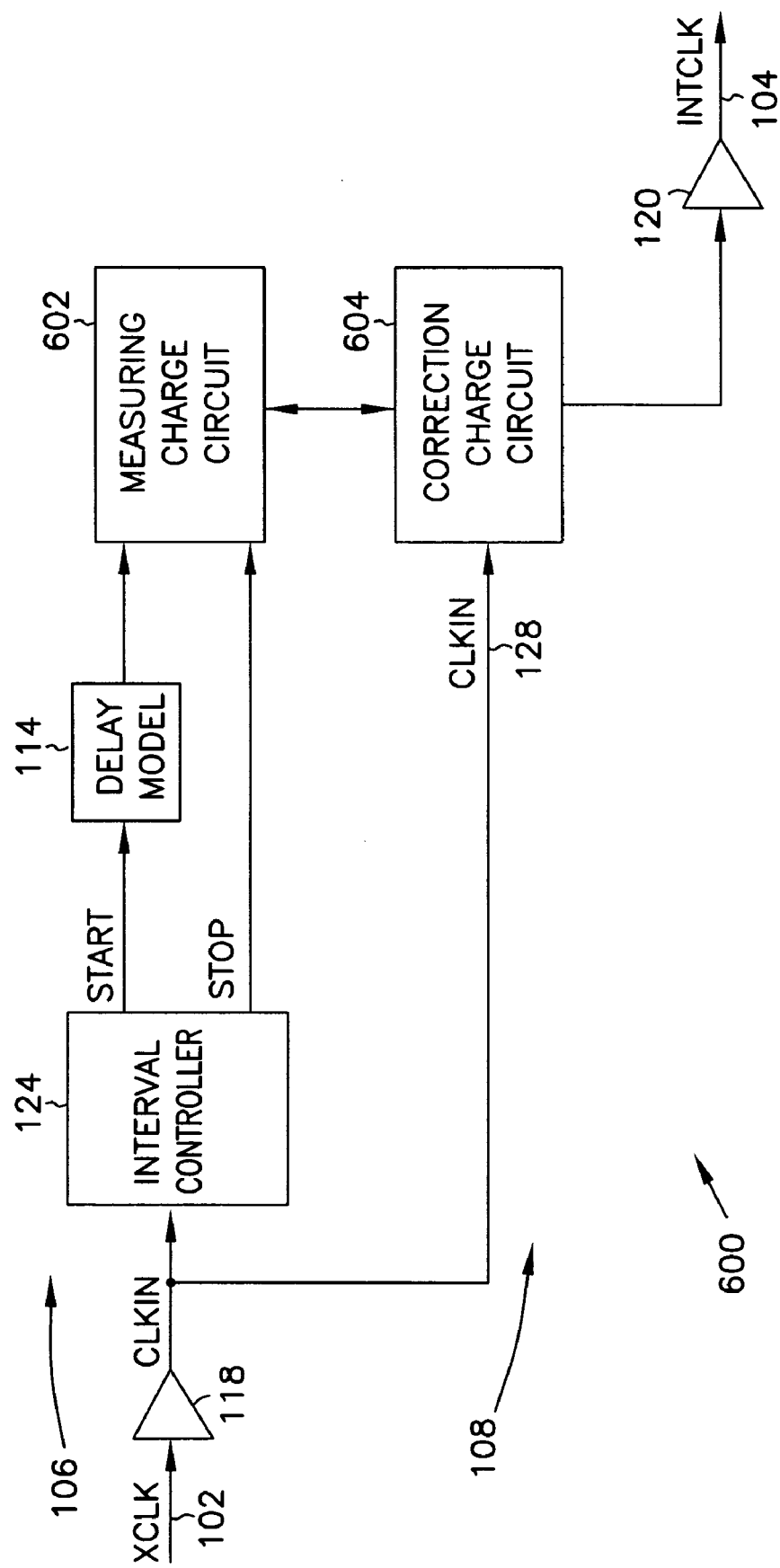
FIG. 6 shows a delay locked circuit having charge circuits according to an embodiment of the invention.

FIG. 6 shows a delay locked circuit having charge circuits according to an embodiment of the invention. Delay locked circuit 600 has measuring path 106 and output path 108. Measuring path 106 has a measuring charge circuit 602. Output path 108 has a correction charge circuit 604. Measuring path 106 obtains a measured delay while measuring charge circuit 602 charges up during $T_{REF}$. Output path 108 applies a correction delay equal to the measured delay while correction charge circuit 604 discharges.

During time $T_{REF}$ of a measurement, measuring charge circuit 602 charges up to a reference charge. The START signal starts the charging process. The STOP signal stops the charging process. The reference charge corresponds to the measured delay. The reference charge is transferred to correction charge circuit 604, which discharges the reference charge. Based on the discharge by correction charge circuit 604, output path 108 applies a correction delay to the CLKIN signal equal to the measured delay.

Figure 7:
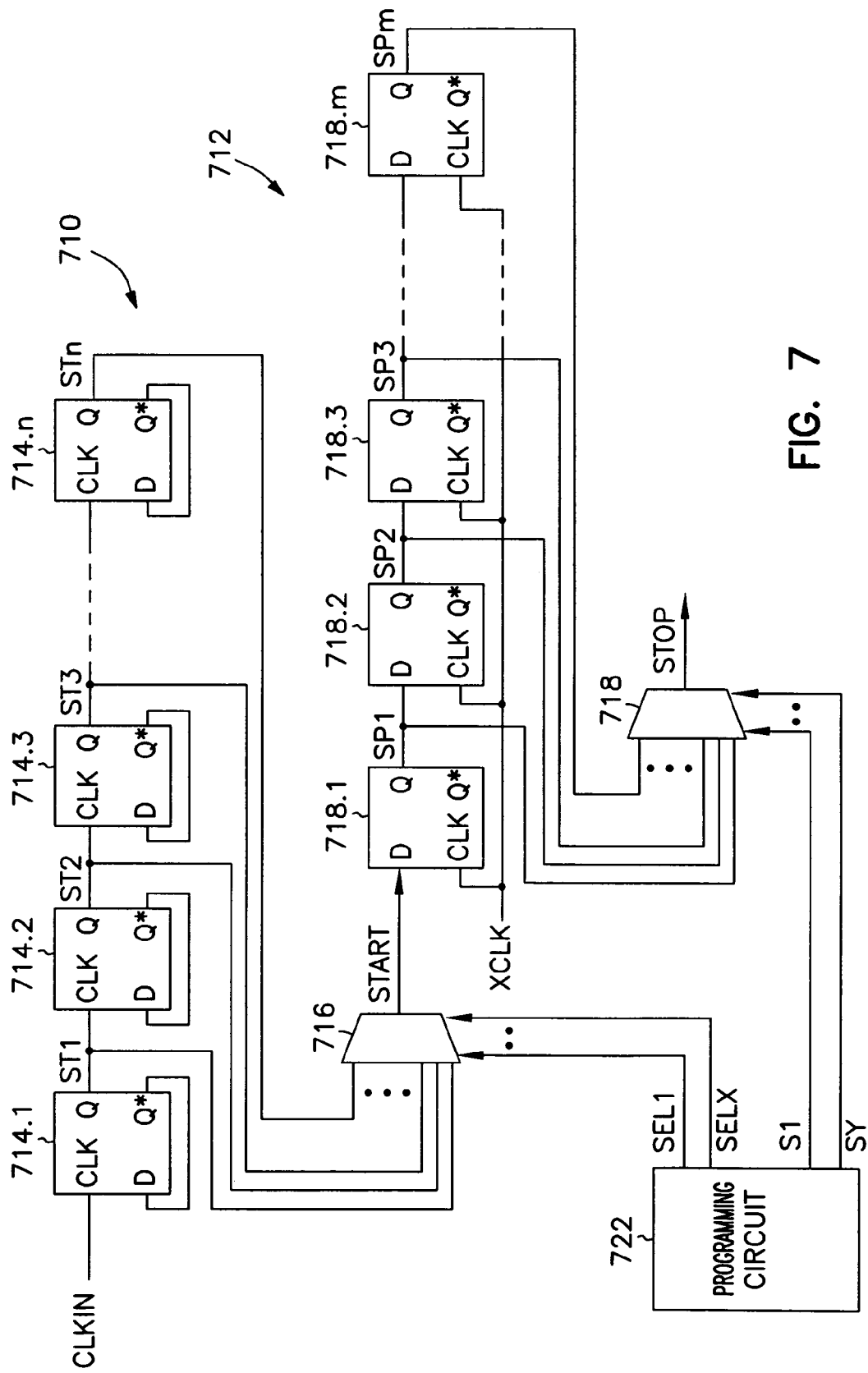
FIG. 7 shows an embodiment of an interval controller of FIG. 1.

FIG. 7 shows an embodiment of interval controller 124 of FIG. 1. Interval controller 124 includes a programmable frequency modifier 710 and a frequency shifter 712. Programmable frequency modifier 710 divides the frequency of the CLKIN signal to generate the START signal. The cycle time of the START signal is greater than the cycle time of the CLKIN signal. Since the CLKIN signal is a delayed version of the XCLK signal, the CLKIN and XCLK signals have an equal cycle time. Therefore, the cycle time of the START signal is also greater than the cycle time of the XCLK signal. Programmable frequency shifter 712 shifts the START signal by one or more cycle time of the XCLK signal.

Programmable frequency modifier 710 includes a plurality of flip flops 714.1–714.n, each having two input nodes CLK and D, and two output nodes Q and Q*. In some embodiments, each of the flip flops 714.1–714.N is a D-Q flip flop. Flip flops 714.1–714.n form a frequency divider that divides the CLKIN signal into a plurality of selectable start signals ST1 through STn. Each succeeding selectable start signal has a cycle time equal to twice the cycle time of the preceding selectable start signal. The STn signal has a cycle time equaled to $2^n$ times the cycle time of the CLKIN signal, where n is the total number of flip flops 714.1–714.n.

A selector 716 selects one of the ST1–STn signals as the START signal based on a combination of select signals SEL1–SELx. In some embodiments, selector 716 is a n:1 multiplexor.

Programmable frequency shifter 712 includes a plurality of flip flops 718.1–718.m, each having two input nodes CLK and D, and two output nodes Q and Q*. In some embodiments, each of the flip flops 718.1–718.m is a D-Q flip flop. Flip flops 718.1–718.m shift the START signal to provide a plurality of selectable stop signals SP1–SPm. Each succeeding selectable stop signal is shifted by one cycle time of the XCLK signal from the preceding selectable stop signal. The STm signal is shifted by m cycle time of the XCLK signal from the SP1 signal, where m is the total number of flip flops 718.1–718.m.

A selector 720 selects one of the SP1–SPm signals as the STOP signal based on a combination of select signals S1–Sy. In some embodiments, selector 716 is a m:1 multiplexor.

A programming circuit 722 connects to selectors 716 and 718. Programming circuit 722 includes fuse devices, electrical fuse devices, laser fuse devices, storage elements, or other programmable elements. These elements are programmed to set a combination of the SEL1–SELx and S1–Sy signals to select the START and STOP signals.

Figure 8:
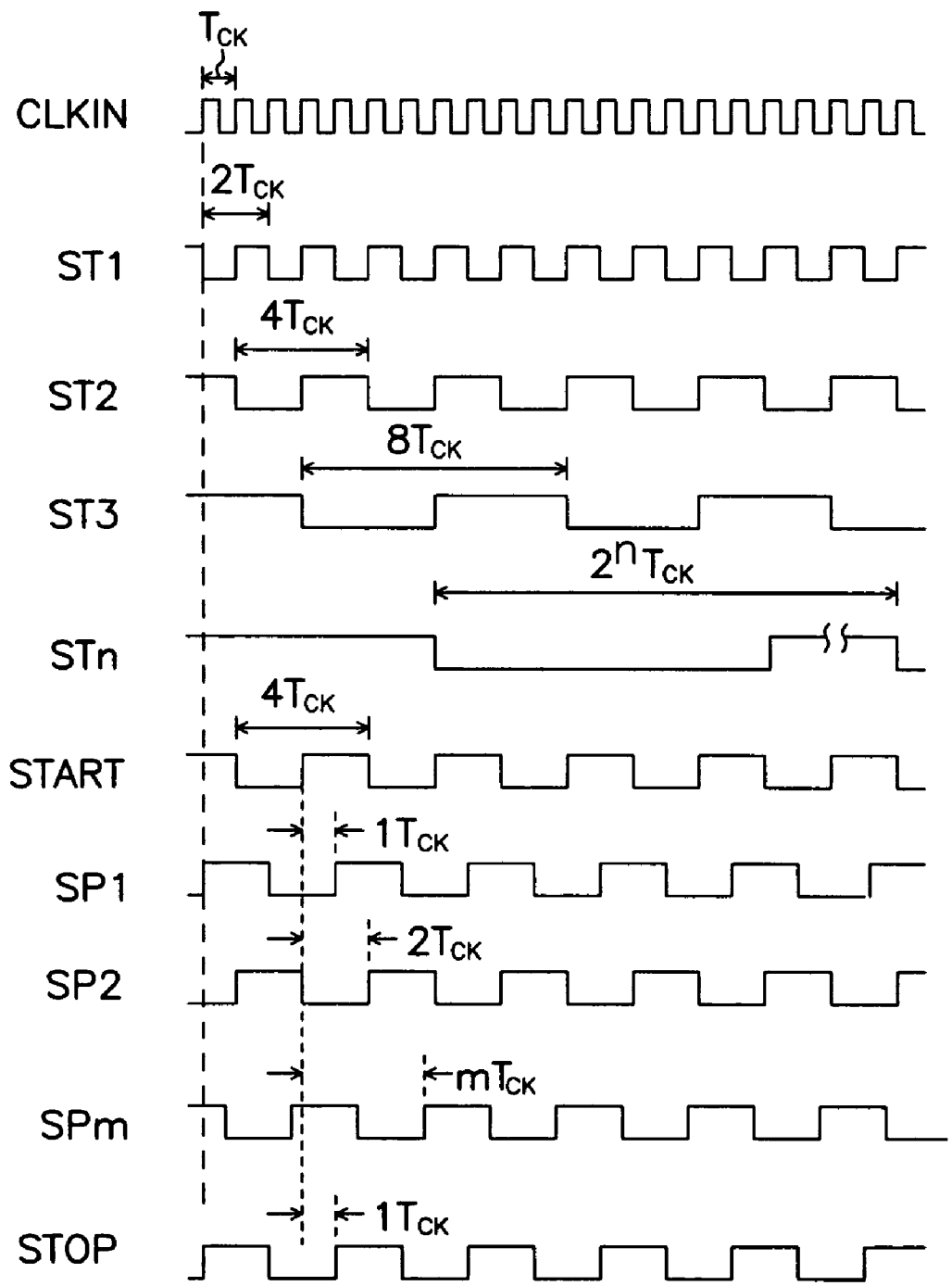
FIG. 8 shows a timing diagram for FIG. 7.

FIG. 8 is a timing diagram for FIG. 7. For clarity, FIG. 8 shows only the ST1, ST2, ST3, and STn signals. The XCLK signal has a cycle time $T_{CK}$. The ST1 signal has a cycle time equaled to $2^1$ times $T_{CK}$ (2 $T_{CK}$). The ST2 signal has a cycle time equaled to $2^2$ times $T_{CK}$ (4 $T_{CK}$). The ST3 signal has a cycle time equaled to $2^3$ times $T_{CK}$ (8 $T_{CK}$). The STn has a cycle time of $2^n$ times $T_{CK}$. In embodiments represented by FIG. 8, the START signal is selected from the ST2 signal as an example. In other embodiments, the START signal can be selected from any one of the ST1–STn signals.

FIG. 8 also shows only the SP1, SP2, and SPm signals for clarity. The SP1, and SP2 signals are shifted from the START signal by one and two $T_{CK}$, respectively. The SPm signals are shifted from the START signal by $mT_{CK}$. In embodiments represented by FIG. 8, the STOP signal is selected from the SP1 signal as an example. In other embodiments, the STOP signal can be selected from any one of the SP1–SPm signals.

Figure 9:
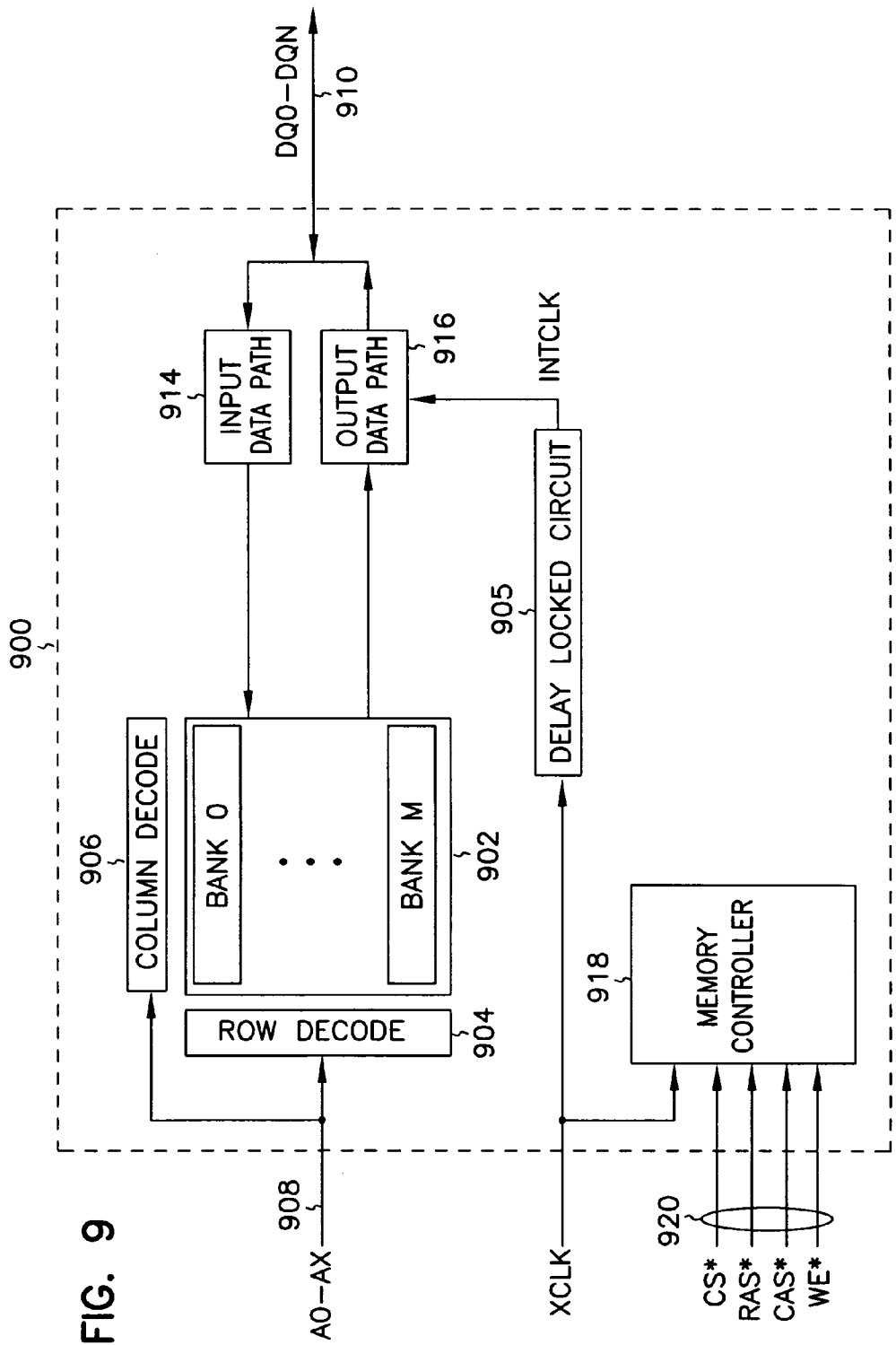
FIG. 9 shows a memory device according to an embodiment of the invention.

FIG. 9 shows memory device according to an embodiment of the invention. Memory device 900 includes a main memory 902 having plurality of memory cells arranged in rows and columns. The memory cells are grouped into a plurality of memory banks indicated by bank 0 through bank M (banks 0–M). Row decode 904 and column decode 906 access the memory cells in response to address signals A0 through AX (A0–AX) on address lines (or address bus) 908. A data input path 914 and a data output path 916 transfer data between banks 0–M and data lines (or data bus) 910. Data lines 910 carry data signals DQ0 through DQN (DQ0–DQN). A memory controller 918 controls the modes of operations of memory device 900 based on control signals on control lines 920. Examples of the control signals include a Chip Select signal CS*, a Row Access Strobe signal RAS*, a Column Access Strobe CAS* signal, a Write Enable signal WE*, and an external signal XCLK.

Memory device 900 further includes a delay locked circuit 905 for delaying the XCLK signal to generate an internal signal INTCLK. The INTCLK signal serves as a clock signal to control a transfer of data on data output path 916. Delay locked circuit 905 periodically performs a measurement. The time interval between one measurement and the next measurement is unequal to the cycle time of the XCLK signal. Delay locked circuit 905 includes embodiments of delay locked circuit 100 (FIG. 1 and FIG. 3).

In some embodiments, memory device 900 is a dynamic random access memory (DRAM) device. In other embodiments, memory device 900 is a static random access memory (SRAM), or flash memory. Examples of DRAM devices include synchronous DRAM commonly referred to as SDRAM (synchronous dynamic random access memory), SDRAM II, SGRAM (synchronous graphics random access memory), DDR SDRAM (double data rate SDRAM), DDR II SDRAM, and Synchlink or Rambus DRAMs. Those skilled in the art recognize that memory device 900 includes other elements, which are not shown for clarity.

Figure 10:
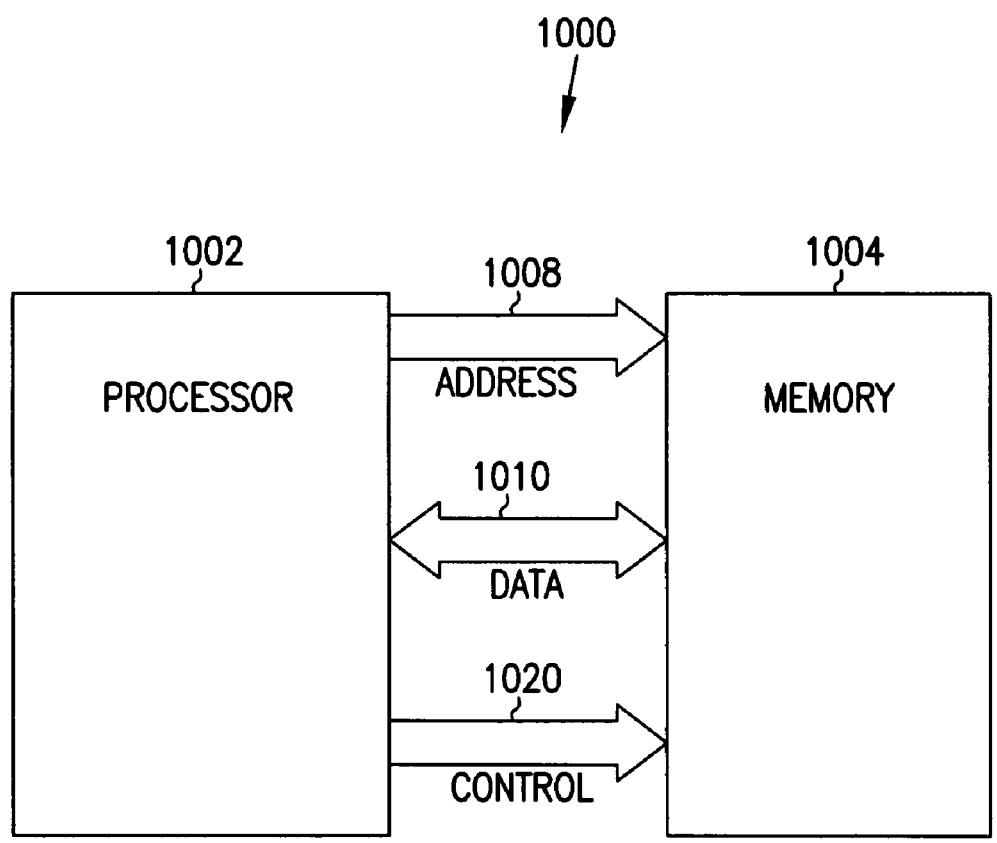
FIG. 10 shows a system according to an embodiment of the invention.

FIG. 10 shows a system 1000 according to an embodiment of the invention. System 1000 includes a first integrated circuit (IC) 1002 and a second IC 1004. IC 1002 and IC 1004 can include processors, controllers, memory devices, application specific integrated circuits, and other types of integrated circuits. In FIG. 10, IC 1002 represents a processor and IC 1002 represents a memory device 1004. Processor 1002 and memory device 1004 communicate using address signals on lines 1008, data signals on lines 1010, and control signals on lines 1020.

Memory device 1004 includes embodiments of memory device 900 (FIG. 9) including delay locked circuit 905, which corresponds to delay locked circuit 100 (FIG. 1 and FIG. 3).

System 1000 includes computers (e.g., desktops, laptops, hand-helds, servers, Web appliances, routers, etc.), wireless communication devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), and the like.

Although specific embodiments are described herein, those skilled in the art recognize that other embodiments may be substituted for the specific embodiments shown to achieve the same purpose. This application covers any adaptations or variations of the present invention. Therefore, the present invention is limited only by the claims and all available equivalents.

What is claimed is:

1. A memory device comprising:
   an input node for receiving an external signal;
   a memory array having row and column of memory cells;
   a row decoder connected to the memory device;
   a column decoder connected to the memory device;
   a plurality of measuring delay elements connected to the input node for delaying the external signal during a measurement to produce a measured delay, wherein the measurement is set to last for at least one cycle time of the external signal;
   an interval controller including a frequency modifier connected between the input nodes and the measuring delay elements for controlling the frequency of the measurement;
   a plurality of correction delay elements connected to the input node for delaying the external signal based on the measured delay to generate an internal signal; and
   an output data path circuit connected to the memory array and the plurality of the correction delay elements for receiving the internal signal to control data transfer from the memory array.

2. A memory device comprising:
   an input node for receiving an external signal;
   a memory array having row and column of memory cells;
   a row decoder connected to the memory device;
   a column decoder connected to the memory device;
   a plurality of measuring delay elements connected to the input node for delaying the external signal during a measurement to produce a measured delay;
   an interval controller connected between the input nodes and the measuring delay elements for controlling the frequency of the measurement;
   a plurality of correction delay elements connected to the input node for delaying the external signal based on the measured delay to generate an internal signal; and
   an output data path circuit connected to the memory array and the plurality of the correction delay elements for receiving the internal signal to control data transfer from the memory array, wherein the interval controller includes a frequency modifier for setting a time interval between one measurement and the next measurement to be unequal to a cycle time of the external signal.

3. The memory device of claim 2, wherein the frequency modifier includes a frequency divider to divide the frequency of the external signal.

4. The memory device of claim 3, wherein the interval controller further includes a frequency shifter for shifting signals produced by the frequency divider.

5. A memory device comprising:
   input nodes for receiving input signals and an external signal;
   a memory array for storing data;
   a decoding circuit for decoding the input signals to access the data;
   an output data path circuit connected to the memory array for transferring the data; and
   a delay locked circuit connected to the input nodes and the data output path, the delay locked circuit including:
      a measuring unit located on a first path for generating a measured delay based on at least one measurement on timing of the external signal on the first path, wherein the measurement is set to last for at least one cycle time of the external signal;
      an interval controller including a frequency modifier located on the first path, the interval controller is configured to control a frequency of the measurement to be unequal to a frequency of the external signal; and
      an adjusting unit located on a second path for delaying the external signal to generate and internal signal based on the measured delay, the adjusting unit including an output node connected to the output data path for providing the internal signal to the output data path circuit to control a transfer of the data between the memory array and the output data path circuit.

6. The memory device of claim 5, wherein the measuring unit includes a delay model connected to an output node of the interval controller for delaying a signal outputted at the output node of the interval controller.

7. The memory device of claim 6, wherein the measuring unit includes a converter connected between the output node of the delay model and the adjusting unit for converting a reference time into the measured delay.

8. A memory device comprising:
   input nodes for receiving input signals and an external signal;
   a memory array for storing data;
   a decoding circuit for decoding the input signals to access the data;
   an output data path circuit connected to the memory array for transferring the data; and
   a delay locked circuit connected to the input nodes and the data output path, the delay locked circuit including:
      a measuring unit located on a first path for generating a measured delay based on at least one measurement on timing of the external signal on the first path;
      an interval controller located on the first path, the interval controller is configured to control a frequency of the measurement to be unequal to a frequency of the external signal; and
      an adjusting unit located on a second path for delaying the external signal to generate and internal signal based on the measured delay, the adjusting unit including an output node connected to the output data path for providing the internal signal to the output data path circuit to control a transfer of the data between the memory array and the output data path circuit, wherein the interval controller includes a frequency modifier connected between the input nodes and the measuring unit for modifying the frequency of the external signal.

9. The memory device of claim 5, wherein the adjusting unit includes a plurality of correction delay elements connected between the input nodes of the memory device and the output nodes of the adjusting unit.

10. A memory device comprising:
input nodes for receiving input signals and an external signal;
a memory array for storing data;
a decoding circuit for decoding the input signals to access the data;
an output data path circuit connected to the memory array for transferring the data; and
a delay locked circuit for generating an internal signal based on the external signal, wherein the output data path circuit connects to the delay locked circuit for receiving the internal signal to control a transfer of data from the memory array, the delay locked circuit including:
 a measuring unit located on a first path for generating a measured delay based on at least one measurement on timing of the external signal on the first path;
 a frequency divider located on the first path for dividing a frequency of the external signal to control a frequency of the measurement such that the frequency of the measurement is unequal to the frequency of the external signal; and
 an adjusting unit located on a second path for delaying the external signal to generate the internal signal based on the measured delay.

11. The memory device of claim 10, wherein the frequency divider includes:
a plurality of flip flops for producing a plurality of selectable signals with unequal frequencies; and
a selector connected to the flip flops for selecting one of the selectable signals to produce a measuring signal.

12. The memory device of claim 11, wherein the measuring unit includes a plurality of measuring delay elements for delaying the measuring signal.

13. The memory device of claim 12, wherein the measuring unit further includes a control logic connected to the plurality of measuring delay elements for stopping the measurement based on a shift signal produced from the measuring signal.

14. The memory device of claim 13, wherein the adjusting unit includes a plurality of correction delay elements for applying a delay to the external signal.

15. A system comprising:
a processor;
a data bus connected to the processor for transferring data; and
a memory device connected to the data bus, the memory device including:
 an input node for receiving an external signal;
 a memory array having row and column of memory cells;
 a row decoder connected to the memory device;
 a column decoder connected to the memory device;
 a plurality of measuring delay elements connected to the input node for delaying the external signal during a measurement to produce a measured delay, wherein the measurement is set to last for at least one cycle time of the external signal;
 an interval controller including a frequency divider connected between the input nodes and the measuring delay elements for controlling the frequency of the measurement;
 a plurality of correction delay elements connected to the input node for delaying the external signal based on the measured delay to generate an internal signal; and
 an output data path circuit connected to the memory array and the plurality of the correction delay elements for receiving the internal signal to control a timing of the data transferred on the data bus.

16. A system comprising:
a processor;
a data bus connected to the processor for transferring data; and
a memory device connected to the data bus, the memory device including:
 an input node for receiving an external signal;
 a memory array having row and column of memory cells;
 a row decoder connected to the memory device;
 a column decoder connected to the memory device;
 a plurality of measuring delay elements connected to the input node for delaying the external signal during a measurement to produce a measured delay;
 an interval controller connected between the input nodes and the measuring delay elements for controlling the frequency of the measurement;
 a plurality of correction delay elements connected to the input node for delaying the external signal based on the measured delay to generate an internal signal; and
an output data path circuit connected to the memory array and the plurality of the correction delay elements for receiving the internal signal to control a timing of the data transferred on the data bus, wherein the interval controller includes a frequency modifier for setting a time interval between one measurement and the next measurement to be unequal to a cycle time of the external signal.

17. The system of claim 16, wherein the frequency modifier includes a frequency divider to divide the frequency of the external signal.

18. The system of claim 17, wherein the interval controller further includes a frequency shifter for shifting signals produced by the frequency divider.

19. A method comprising:
receiving at a memory device input signals including an external signal;
propagating the external signal on a first signal path and on a second signal path;
performing a number of measurements on the first signal path to obtain a reference time based on a cycle time of the external signal, wherein a time interval between consecutive measurements among the number of measurements is unequal to the cycle time of the external signal, wherein performing the number of measurements includes modifying the frequency of the external signal, and wherein at least one of the measurements lasts for at least one cycle time of the external signal;
generating a measured delay based on the reference time;
using the measured delay to adjust a delay applied to the external signal on the second signal path to generate an internal signal;
accessing data in a memory array of the memory device based on the input signals; and transferring the data from the memory array to an output data path based on the internal signal.

20. The method of claim 19, wherein performing the number of measurements includes delaying the external signal for a portion of the cycle time of the external signal in each of the measurements.

21. The method of claim 19, wherein the measured delay represents a number of delay elements.

22. The method of claim 19, wherein the delay applied to the external signal on the second signal path equals the measured delay.

23. The method of claim 19, wherein the time interval between consecutive measurements among the number of measurements is greater than the cycle time of the external signal.

24. A method comprising:
providing an external signal to a memory device;
providing plurality of address signals to the memory device;
propagating the external signal through a number of measuring delay elements on a measuring path;
acquiring a measured delay by performing a first measurement on the measuring path, wherein the first measurement lasts for at least one cycle time of the external signal, and wherein performing the first measurement includes modifying the frequency of the external signal;
propagating the external signal through a number of correction delay elements on an output signal path to produce an internal signal;
adjusting a delay on the output signal path based on the measured delay;
performing a second measurement to adjust the signal relationship between the external and internal signals, wherein a time interval between the first measurement and the second measurement is unequal to the cycle time of the external signal;
accessing data in a memory array of the memory device based on the address signals; and
using the internal signal for outputting the data from the memory array to an output data path.

25. The method of claim 24, wherein performing the first measurement includes:
applying a model time delay to the measuring path;
producing a reference time based on a function of the model time delay and the cycle time of the external signal; and
converting the reference time to the measured delay.

26. A method comprising:
providing an external signal to a memory device;
providing plurality of address signals to the memory device;
propagating the external signal through a number of measuring delay elements on a measuring path;
acquiring a measured delay by performing a first measurement on the measuring path, wherein performing the first measurement includes applying a model time delay to the measuring path, producing a reference time based on a function of the model time delay and the cycle time of the external signal, and converting the reference time to the measured delay;
propagating the external signal through a number of correction delay elements on an output signal path to produce an internal signal;
adjusting a delay on the output signal path based on the measured delay;
performing a second measurement to adjust the signal relationship between the external and internal signals, wherein a time interval between the first measurement and the second measurement is unequal to the cycle time of the external signal;
accessing data in a memory array of the memory device based on the address signals; and
using the internal signal for outputting the data from the memory array to an output data path, wherein producing the reference time includes subtracting the model delay time from at least one cycle time of the external signal.

27. The method of claim 24, wherein adjusting the delay on the output path includes applying a correction delay equal to the measured delay to the output signal path.

28. A method comprising:
providing an external signal to a memory device;
providing plurality of row address signals to the memory device;
providing plurality of column address signals to the memory device;
propagating the external signal on a measuring path;
propagating the external signal on an output signal path to generate an internal signal;
periodically performing a measurement at a measuring frequency on the measuring path to synchronize the external and internal signals, wherein a frequency of the external signal is greater than the measuring frequency, wherein the measurement lasts for at least one cycle time of the external signal, and wherein performing the measurement includes modifying the frequency of the external signal;
accessing data in a memory array of the memory device based on the row address signals and the column address signals; and
transferring the data from the memory array to an output data path based on the internal signal.

29. The method of claim 28, wherein periodically performing the measurement includes starting the measurement based on an edge of a start signal having a cycle time greater than the cycle time of the external signal.

30. A method comprising:
providing an external signal to a memory device;
providing plurality of row address signals to the memory device;
providing plurality of column address signals to the memory device;
propagating the external signal on a measuring path;
propagating the external signal on an output signal path to generate an internal signal;
periodically performing a measurement at a measuring frequency on the measuring path to synchronize the external and internal signals, wherein a frequency of the external signal is greater than the measuring frequency, wherein periodically performing the measurement includes starting the measurement based on an edge of a start signal having a cycle time greater than the cycle time of the external signal, wherein periodically performing the measurement further includes stopping the measurement based on an edge of a stop signal, the stop signal being shifted from the start signal by at least one cycle of the external signal, and wherein performing the measurement includes modifying the frequency of the external signal;
accessing data in a memory array of the memory device based on the row address signals and the column address signals; and transferring the data from the memory array to an output data path based on the internal signal.

31. A method comprising:

providing an external signal to a memory device;

providing plurality of address signals to the memory device;

dividing a frequency of the external signal to produce a start signal;

propagating the start signal on a first signal path;

performing a first measurement on the first signal path to acquire a measured delay, wherein the first measurement lasts for at least one cycle time of the external signal;

propagating the external signal on a second signal path to produce an internal signal;

applying the measured delay to the second path based on the measured delay;

performing a second measurement to adjust the signal relationship between the external and internal signals, wherein a time interval between the first measurement and the second measurement is unequal to the cycle time of the external signal;

accessing data in memory cells of the memory device based on the address signals; and using the internal signal to control a transfer of the data between the memory cells and an output data path.

32. The method of claim 31, wherein the external signal has a frequency greater than a frequency of the start signal.

33. The method of claim 31, wherein the external signal has a frequency equal to a multiple of a frequency of the start signal.

34. The method of claim 31, wherein propagating the start signal on the first signal path includes propagating the start signal through a number of measuring delay elements.

35. The method of claim 34 wherein propagating the external signal on the second signal path includes propagating the external signal through a number of correction delay elements.

36. The method of claim 35, wherein the number of measuring delay elements and the number of correction delay elements are equal.

* * * * *

UNITED STATES PATENT AND TRADEMARK OFFICE
CERTIFICATE OF CORRECTION

PATENT NO. : 7,212,057 B2 Page 1 of 1
APPLICATION NO. : 10/771611
DATED : May 1, 2007
INVENTOR(S) : Gomm et al.

It is certified that error appears in the above-identified patent and that said Letters Patent is hereby corrected as shown below:

In column 2, line 46, delete "$(T_{DL}-T_{IN}+T_{OUT})$" and insert -- $(T_{DL}=T_{IN}+T_{OUT})$ --, therefor.

Signed and Sealed this

Seventh Day of August, 2007

JON W. DUDAS
*Director of the United States Patent and Trademark Office*